United States Patent
Cherry et al.

(10) Patent No.: US 7,198,964 B1
(45) Date of Patent: Apr. 3, 2007

(54) METHOD AND APPARATUS FOR DETECTING FAULTS USING PRINCIPAL COMPONENT ANALYSIS PARAMETER GROUPINGS

(75) Inventors: Gregory A. Cherry, Kyle, TX (US); Daniel Kadosh, Austin, TX (US)

(73) Assignee: Advanced Micro Devices, Inc., Austin, TX (US)

(*) Notice: Subject to any disclaimer, the term of this patent is extended or adjusted under 35 U.S.C. 154(b) by 359 days.

(21) Appl. No.: 10/770,681

(22) Filed: Feb. 3, 2004

(51) Int. Cl.
*H01L 21/66* (2006.01)

(52) U.S. Cl. .................. 438/14; 257/E21.521

(58) Field of Classification Search ............ 438/5, 438/7, 10–11, 14, 16–18, 22–24, 29, 31, 34–36, 438/128–130, 149, 484, 538
See application file for complete search history.

(56) References Cited

U.S. PATENT DOCUMENTS

| | | | | |
|---|---|---|---|---|
| 5,053,815 A | 10/1991 | Wendell | ................. | 355/208 |
| 5,625,816 A | 4/1997 | Burdick et al. | ............. | 395/614 |
| 5,655,110 A | 8/1997 | Krivokapic et al. | ........ | 395/500 |
| 5,659,467 A | 8/1997 | Vickers | ..................... | 364/138 |
| 5,844,850 A | 12/1998 | Tsutsui et al. | .............. | 365/200 |
| 5,965,306 A | 10/1999 | Mansfield et al. | ............ | 430/22 |
| 5,985,497 A | 11/1999 | Phan et al. | ................... | 430/30 |
| 6,278,515 B1 | 8/2001 | Knight et al. | ................. | 355/55 |
| 6,298,470 B1 | 10/2001 | Breiner et al. | ................. | 716/4 |
| 6,369,891 B1 | 4/2002 | Kane et al. | ................. | 346/401 |
| 6,392,434 B1 | 5/2002 | Chiu | ........................ | 324/765 |
| 6,445,206 B1 | 9/2002 | Montull et al. | ............ | 324/765 |
| 6,486,492 B1 | 11/2002 | Su | .............................. | 257/48 |
| 6,535,776 B1 | 3/2003 | Tobin, Jr. et al. | .......... | 700/110 |
| 6,587,744 B1 | 7/2003 | Stoddard et al. | ............ | 700/121 |
| 6,623,333 B1 | 9/2003 | Patel et al. | .................... | 451/9 |
| 6,636,843 B2 | 10/2003 | Doddi et al. | .................. | 706/46 |
| 6,706,543 B2* | 3/2004 | Tanaka et al. | ................ | 438/14 |
| 6,776,939 B2* | 8/2004 | Liu | .......................... | 264/45.1 |
| 6,790,686 B1* | 9/2004 | Purdy et al. | .................. | 438/14 |
| 6,959,224 B2* | 10/2005 | Good et al. | .................. | 700/97 |
| 2001/0020194 A1 | 9/2001 | Takagi et al. | ............... | 700/109 |
| 2002/0121915 A1 | 9/2002 | Montull et al. | ............ | 324/765 |
| 2003/0045007 A1* | 3/2003 | Tanaka et al. | ................ | 438/5 |
| 2005/0125090 A1* | 6/2005 | Sakano et al. | ............. | 700/108 |

* cited by examiner

*Primary Examiner*—Walter Lindsay, Jr.
*Assistant Examiner*—Andre' Stevenson
(74) *Attorney, Agent, or Firm*—Williams, Morgan & Amerson, P.C.

(57) ABSTRACT

A method for identifying faults in a semiconductor fabrication process includes storing measurements for a plurality of parameters of a wafer in the semiconductor fabrication process. A first subset of the parameters is selected. The subset is associated with a feature formed on the wafer. A principal component analysis model is applied to the first subset to generate a performance metric. A fault condition with the wafer is identified based on the performance metric. A system includes a data store and a fault monitor. The data store is adapted to store measurements for a plurality of parameters of a wafer in a semiconductor fabrication process. The fault monitor is adapted to select a first subset of the parameters, the subset being associated with a feature formed on the wafer, apply a principal component analysis model to the first subset to generate a performance metric, and identify a fault condition with the wafer based on the performance metric.

38 Claims, 4 Drawing Sheets

METHOD AND APPARATUS FOR DETECTING FAULTS USING PRINCIPAL COMPONENT ANALYSIS PARAMETER GROUPINGS

BACKGROUND OF THE INVENTION

1. Field of the Invention

This invention relates generally to the field of semiconductor device manufacturing and, more particularly, to a method and apparatus for detecting faults using principal component analysis parameter groupings.

2. Description of the Related Art

There is a constant drive within the semiconductor industry to increase the quality, reliability and throughput of integrated circuit devices, e.g., microprocessors, memory devices, and the like. This drive is fueled by consumer demands for higher quality computers and electronic devices that operate more reliably. These demands have resulted in a continual improvement in the manufacture of semiconductor devices, e.g., transistors, as well as in the manufacture of integrated circuit devices incorporating such transistors. Additionally, reducing the defects in the manufacture of the components of a typical transistor also lowers the overall cost of integrated circuit devices incorporating such transistors.

Generally, a set of processing steps is performed on a lot of wafers using a variety of processing tools, including photolithography steppers, etch tools, deposition tools, polishing tools, rapid thermal processing tools, implantation tools, etc. The technologies underlying semiconductor processing tools have attracted increased attention over the last several years, resulting in substantial refinements. However, despite the advances made in this area, many of the processing tools that are currently commercially available suffer certain deficiencies. In particular, such tools often lack advanced process data monitoring capabilities, such as the ability to provide historical parametric data in a user-friendly format, as well as event logging, real-time graphical display of both current processing parameters and the processing parameters of the entire run, and remote, i.e., local site and worldwide, monitoring. Additionally, in some instances adequate metrology data cannot be collected due to uncertainties regarding what parameters to measure, the impossibility of measuring certain parameters, or cost concerns. These deficiencies can engender non-optimal control of critical processing parameters, such as throughput, accuracy, stability and repeatability, processing temperatures, mechanical tool parameters, and the like. This variability manifests itself as within-run disparities, run-to-run disparities and tool-to-tool disparities that can propagate into deviations in product quality and performance, whereas an ideal monitoring and diagnostics system for such tools would provide a means of monitoring this variability, as well as providing means for optimizing control of critical parameters.

The manufacture of semiconductor products, such as microprocessors and flash memory devices, requires a distinct sequence of individual operations to be performed on silicon wafers in order to produce final products that meet certain electrical performance requirements. In some cases, electrical measurements that determine the performance of the fabricated devices are not conducted until relatively late in the fabrication process, and sometimes not until the final test stage.

The inline semiconductor operations, such as processing and metrology, have been historically monitored by charting univariate data. The processes would be considered abnormal when one or more of the measurements were outside an allowable range of values. In contrast, if the measurements were inside the allowable range, they would be assumed to be processed correctly.

However, as the volume of wafers produced and the amount of available data has increased, monitoring individual measurements has become time consuming, and sometimes, impracticable. Additionally, correlation among parameters reduces the ability of univariate statistical process control (SPC) to detect certain types of faults.

Despite the quantity of data that is collected as wafers are processed down the manufacturing line, the inline parameters do not provide a complete picture as to how all of the devices will perform when they are electrically tested at the end of the line. Even when individual processes are performing within their specifications, poor electrical performance can result due to cumulative effects from multiple tools and operations. Additionally, some process disturbances are undetected because of inadequacies in the fault detection and classification (FDC) system or due to the existence of disturbances that cannot be measured by existing technology.

The present invention is directed to overcoming, or at least reducing the effects of, one or more of the problems set forth above.

SUMMARY OF THE INVENTION

One aspect of the present invention is seen in a method for identifying faults in a semiconductor fabrication process. The method includes storing measurements for a plurality of parameters of a wafer in the semiconductor fabrication process. A first subset of the parameters is selected. The subset is associated with a feature formed on the wafer. A principal component analysis model is applied to the first subset to generate a performance metric. A fault condition with the wafer is identified based on the performance metric.

Another aspect of the present invention is seen in a system including a data store and a fault monitor. The data store is adapted to store measurements for a plurality of parameters of a wafer in a semiconductor fabrication process. The fault monitor is adapted to select a first subset of the parameters, the subset being associated with a feature formed on the wafer, apply a principal component analysis model to the first subset to generate a performance metric, and identify a fault condition with the wafer based on the performance metric.

BRIEF DESCRIPTION OF THE DRAWINGS

The invention may be understood by reference to the following description taken in conjunction with the accompanying drawings, in which like reference numerals identify like elements, and in which.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 1:
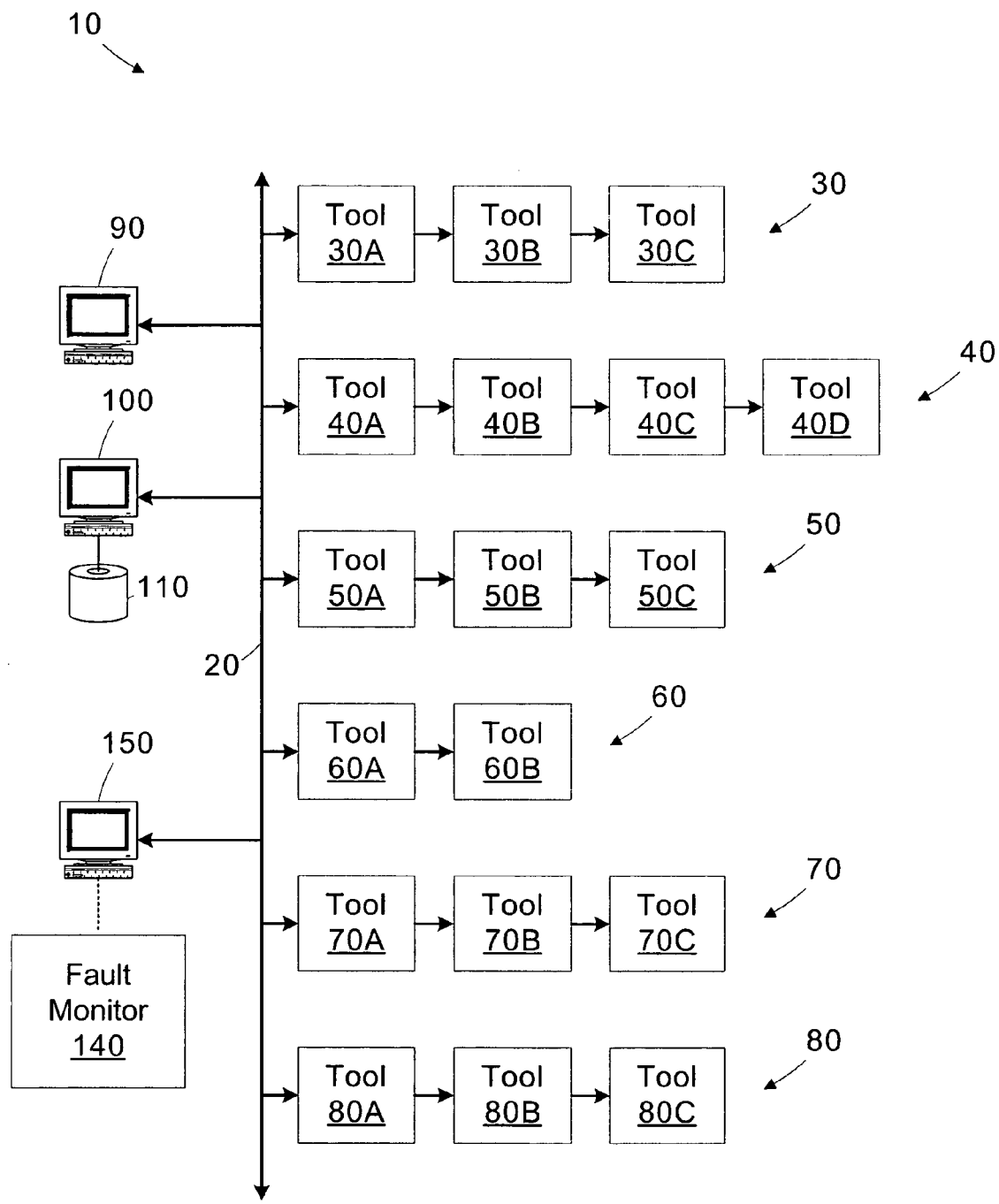
FIG. 1 is a simplified block diagram of a manufacturing system in accordance with one illustrative embodiment of the present invention.

Referring to FIG. 1, a simplified block diagram of an illustrative manufacturing system 10 is provided. In the illustrated embodiment, the manufacturing system 10 is adapted to fabricate semiconductor devices. Although the invention is described as it may be implemented in a semiconductor fabrication facility, the invention is not so limited and may be applied to other manufacturing environments. The techniques described herein may be applied to a variety of workpieces or manufactured items, including, but not limited to, microprocessors, memory devices, digital signal processors, application specific integrated circuits (ASICs), or other similar devices. The techniques may also be applied to workpieces or manufactured items other than semiconductor devices.

A network 20 interconnects various components of the manufacturing system 10, allowing them to exchange information. The illustrative manufacturing system 10 includes a plurality of tools 30–80. Each of the tools 30–80 may be coupled to a computer (not shown) for interfacing with the network 20. The tools 30–80 are grouped into sets of like tools, as denoted by lettered suffixes. For example, the set of tools 30A–30C represent tools of a certain type, such as a chemical mechanical planarization tool. A particular wafer or lot of wafers progresses through the tools 30–80 as it is being manufactured, with each tool 30–80 performing a specific function in the process flow. Exemplary processing tools for a semiconductor device fabrication environment include metrology tools, photolithography steppers, etch tools, deposition tools, polishing tools, rapid thermal processing tools, implantation tools, etc. The tools 30–80 are illustrated in a rank and file grouping for illustrative purposes only. In an actual implementation, the tools 30–80 may be arranged in any physical order or grouping. Additionally, the connections between the tools in a particular grouping are meant to represent connections to the network 20, rather than interconnections between the tools 30–80.

A manufacturing execution system (MES) server 90 directs high level operation of the manufacturing system 10. The MES server 90 monitors the status of the various entities in the manufacturing system 10 (i.e., lots, tools 30–80) and controls the flow of articles of manufacture (e.g., lots of semiconductor wafers) through the process flow. A database server 100 is provided for storing data related to the status of the various entities and articles of manufacture in the process flow. The database server 100 may store information in one or more data stores 110. The data may include pre-process and post-process metrology data, tool states, lot priorities, etc. The MES server 90 controls the path of a particular lot of wafers through the tools 30–80 and sends path information to the database server 100. Based on the path information stored by the database server 100, a tool set history may be generated for a particular lot of wafers.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary information exchange and process control framework suitable for use in the manufacturing system 10 is an Advanced Process Control (APC) framework, such as may be implemented using the Catalyst system previously offered commercially by KLA-Tencor, Inc. The Catalyst system uses Semiconductor Equipment and Materials International (SEMI) Computer Integrated Manufacturing (CIM) Framework compliant system technologies and is based the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI, which is headquartered in Mountain View, Calif.

The processing and data storage functions are distributed amongst the different computers or workstations in FIG. 1 to provide general independence and central information storage. Of course, different numbers of computers and different arrangements may be used without departing from the spirit and scope of the instant invention.

The manufacturing system 10 also includes a fault monitor 140 executing on a workstation 150. As described in greater detail below, the fault monitor 140 employs a principal component analysis (PCA) technique to identify fault conditions with the manufactured devices. During the fabrication of a typical semiconductor die, hundreds of physical and electrical parameters are measured. The particular parameters measured may vary widely based on the type of device being fabricated.

Principal component analysis (PCA) is a multivariate technique that models the correlation structure in the data by reducing the dimensionality of the data. A data matrix, X, of n samples (rows) and m variables (columns) can be decomposed as follows:

$$X = \hat{X} + \tilde{X}. \tag{1}$$

where the columns of X are typically normalized to zero mean and unit variance. The matrices $\hat{X}$ and $\tilde{X}$ are the modeled and unmodeled residual components of the X matrix, respectively. The modeled and residual matrices can be written as $$\hat{X} = TP^T \text{ and } \tilde{X} = \tilde{T}\tilde{P}^T, \tag{2}$$

where $T \in \Re^{n \times l}$ and $P \in \Re^{m \times l}$ are the score and loading matrices, respectively, and l is the number of principal components retained in the model. It follows that $\tilde{T} \in \Re^{n \times (m-l)}$ and $\tilde{P} \in \Re^{m \times (m-l)}$ are the residual score and loading matrices, respectively.

The loading matrices, P and $\tilde{P}$, are determined from the eigenvectors of the correlation matrix, R, which can be approximated by $$R \approx \frac{1}{n-1} X^T X. \tag{3}$$

The first l eigenvectors of R (corresponding to the largest eigenvalues) are the loadings, P, and the eigenvectors corresponding to the remaining m–l eigenvalues are the residual loadings, $\tilde{P}$.

The number of principal components (PCs) retained in the model is an important factor in fault detection with PCA. If too few PCs are retained, the model will not capture all of the information in the data, and a poor representation of the process will result. On the other hand, if too many PCs are chosen, then the model will be over parameterized and will include noise. The variance of reconstruction error (VRE) criterion for selecting the appropriate number of PCs is based on omitting parameters and using the model to reconstruct the missing data. The number of PCs which results in the best data reconstruction is considered the optimal number of PCs to be used in the model. Other, well-established methods for selecting the number of PCs include the average eigenvalues method, cross validation, etc.

A variant of PCA is recursive PCA (RPCA). To implement an RPCA algorithm it is necessary to first recursively calculate a correlation matrix. Given a new vector of unscaled measurements, $x_{k+1}^0$, the updating equation for the correlation matrix is given by $$R_{k+1} = \rho \Sigma_{k+1}^{-1} (\Sigma_k R_k \Sigma_k + \Delta b_{k+1} \Delta b_{k+1}^T) \Sigma_{k+1}^{-1} + (1-\mu) x_{k+1} x_{k+1}^T, \tag{4}$$

where $x_{k+1}$ is the scaled vector of measurements, b is a vector of means of the data, and $\Sigma$ is a diagonal matrix with the $i^{th}$ element being the standard deviation of the $i^{th}$ variable. The mean and variance are updated using $$b_{k+1} = \mu b_k + (1-\mu) x_{k+1}^0, \text{ and} \tag{5}$$

$$\sigma_{k+1}^2(i) = \mu(\sigma_k^2(i) + \Delta b_{k+1}^2(i)) + (1-\mu) \times \|x_{k+1}^0(i) - b_{k+1}(i)\|^2. \tag{6}$$

The forgetting factor, $\mu$, is used to weight more recent data heavier than older data. A smaller $\mu$ discounts data more quickly.

After the correlation matrix has been recursively updated, calculating the loading matrices is performed in the same manner as ordinary PCA. It is also possible to employ computational shortcuts for recursively determining the eigenvalues of the correlation matrix, such as rank-one modification.

Fault detection using PCA models is accomplished by considering two statistics, the squared prediction error (SPE) the Hotelling's $T^2$ statistic. These statistics may be combined to generate a combined index, as discussed below. The SPE indicates the amount by which a process measurement deviates from the model with $$SPE = x^T(I - PP^T)x = x^T \Phi_{SPE} x, \tag{7}$$

where $$\Phi_{SPE} = I - PP^T. \tag{8}$$

Hotelling's $T^2$ statistic which measures deviation of a parameter inside the process model using $$T^2 = x^T P \Lambda^{-1} P^T x = x^T \Phi_{T^2} x, \tag{9}$$

where $$\Phi_{T^2} = P \Lambda^{-1} P^T, \tag{10}$$

and $\Lambda$ is a diagonal matrix containing the principal eigenvalues used in the PCA model. The notation using $\Phi_{SPE}$ and $\Phi_{T^2}$ is provided to simplify the multiblock calculations included in the next section. The process is considered normal if both of the following conditions are met:

$$SPE \leq \delta^2$$

$$T^2 \leq \chi_l^2, \tag{11}$$

where $\delta^2$ and $\chi_l^2$ are the confidence limits for the SPE and $T^2$ statistics, respectively. It is assumed that x follows a normal distribution and $T^2$ follows a $\chi^2$ distribution with l degrees of freedom.

The SPE and $T^2$ statistics may be combined into the following single combined index for the purpose of fault detection $$\varphi = \frac{SPE(x)}{\delta^2} + \frac{T^2(x)}{\chi_l^2} = x^T \Phi x, \tag{12}$$

where $$\Phi = \frac{P \Lambda^{-1} P^T}{\chi_l^2} + \frac{I - PP^T}{\delta^2}. \tag{13}$$

The confidence limits of the combined index are determined by assuming that $\varphi$ follows a distribution proportional to the $\chi^2$ distribution. It follows that $\varphi$ is considered normal if $$\varphi \leq g\chi_\alpha^2(h) \tag{14}$$

where $\alpha$ is the confidence level. The coefficient, g, and the degrees of freedom, h, for the $\chi^2$ distribution are given by $$g = \frac{tr(R\Phi)^2}{tr(R\Phi)}, \text{ and} \quad (15)$$

$$h = \frac{[tr(R\Phi)]^2}{tr(R\Phi)^2}. \quad (16)$$

To provide an efficient and reliable method for grouping sets of variables together and identifying the source identified faults, a multiblock analysis approach may be applied to the $T^2$ and SPE. The following discussion describes those methods and extends them to the combined index. Using an existing PCA model, a set of variables of interest $x_b$ can be grouped into a single block as follows:

$$x^T = [x_1^T \ldots x_b^T \ldots x_B^T]. \quad (17)$$

The variables in block b should have a distinct relationship among them that allows them to be grouped into a single category for fault classification purposes. The correlation matrix and $\Phi$ matrices are then partitioned in a similar fashion.

$$R = \begin{bmatrix} R_1 & & & \\ & \ddots & & \\ & & R_b & \\ & & & \ddots \\ & & & & R_B \end{bmatrix} \quad (18)$$

$$\Phi = \begin{bmatrix} \Phi_1 & & & \\ & \ddots & & \\ & & \Phi_b & \\ & & & \ddots \\ & & & & \Phi_B \end{bmatrix} \quad (19)$$

The contributions associated with block b for the SPE and $T^2$ and extended here to the combined index can be written as $$T_b^2 = x_b^T \Phi_{T_b^2} x_b \quad (20)$$

$$SPE_b = x_b^T \Phi_{SPE_b} x_b \quad (21)$$

$$\varphi_b = x_b^T \Phi_{\varphi_b} x_b. \quad (22)$$

The confidence limits for each of these quantities is calculated by modifying Equations 14, 15, and 16 to incorporate the multiblock quantities. While defined for the combined index, similar calculations hold for SPE and $T^2$.

$$g_{\varphi_b} = \frac{tr(R_b \Phi_{\varphi_b})^2}{tr(R_b \Phi_{\varphi_b})} \quad (23)$$

$$h_{\varphi_b} = \frac{[tr(R_b \Phi_{\varphi_b})]^2}{tr(R_b \Phi_{\varphi_b})^2} \quad (24)$$

$$\varphi_{b,lim} = g_{\varphi_b} \chi^2(h_{\varphi_b}) \quad (25)$$

The fault monitor 140 has access to hundreds of physical and electrical measurements gathered during the fabrication of the semiconductor devices. The fault monitor 140 groups the data points into subsets that relate to different features formed on the semiconductor wafer. For example one subset may be related to a particular layer on the wafer. Another subset may be related to a particular device on the wafer, such as a transistor or flash memory cell. The fault monitor 140 generates a combined index for each defined subset and compares the generated combined index to the confidence limits generated for the subset. Based on the comparison between the combined index and the confidence limits, the fault monitor 140 identifies a fault condition.

Because the subsets are already associated with various features of the semiconductor wafer, the fault condition may be readily associated with a particular layer or device for fault investigation and classification. As described in greater detail below, the fault monitor 140 may also use the subset grouping to identify a particular tool responsible for contributing to the fault condition. A commonality analysis may be conducted by evaluating the processing histories of a group of faulty wafers or devices. The fault monitor 140 identifies the layer associated with the fault condition and then determines from the processing histories which tools were used to process the layer in question. If a particular tool experiences a mechanical failure or has deteriorated with time, its continued operation will lead to misprocessed wafers and consequently a reduction of product value and/or yield. By tracing the multivariate analysis results to a specific tool, the fault monitor 140 provide information to other entities in the manufacturing system 10 to switch tools offline for maintenance or to direct product to tools that provide superior levels of performance.

Information from the fault monitor 140 provides statistics that may be used to classify the variables responsible for any abnormal behavior. A classification engine (i.e., included in or separate from the fault monitor 140) may then identify the root cause of the fault by either applying a set of rules to the classification statistics or by comparing the current fault against known fault classes. The classification engine may also identify new fault classes as they occur, and take action based on the product risk associated with each fault class.

In one embodiment, of the present invention, the fault monitor 140 is adapted to monitor Wafer Electrical Test (WET) data. One feature of PCA is its ability to model a large number of correlated variables using a much smaller number of principal components. It is this feature that makes it useful for modeling the hundreds of WET data measurements that are collected from each wafer. Typically, these measurements are highly correlated because they are measured at multiple sites on the wafers and are often related to similar characteristics. The fault monitor 140 may identify wafers with abnormal electrical measurements and determine which WET parameters are responsible for the abnormal behavior. The fault monitor 140 applies a PCA model to predetermined groupings of the parameters monitored to generate a performance metric. The performance metric may include the squared prediction error, the Hotelling's $T^2$ statistic, or the combined index.

Typically, there are often several electrical parameters associated with particular layers or devices on the wafer. The electrical parameters are measured at several sites on the wafer in order to observe the wafer uniformity. The fault monitor 140 may use logical groupings of these measurements. For example, measurements may be averaged across, sites and/or wafers. In some cases, a problem could be an issue with a single site on the wafer across multiple layers. In such a case, a first overview analysis may be implemented using a site average, and a subsequent detailed analysis may be performed for each site to identify a problem with a particular site.

Figure 2:
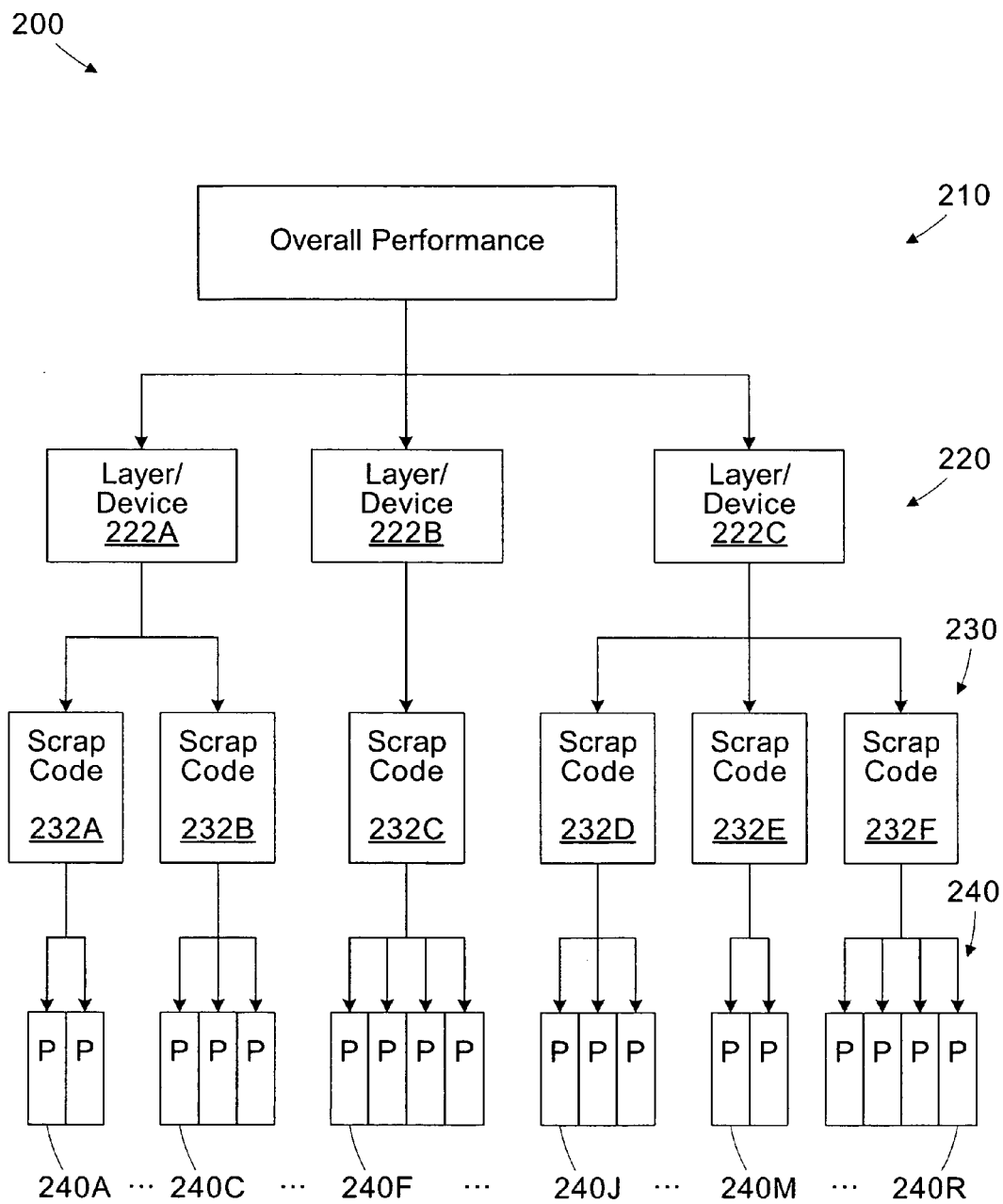
FIG. 2 is a diagram of an analysis hierarchy for identifying fault conditions in the system of FIG. 1.

Referring now to FIG. 2, a simplified diagram of an analysis hierarchy 200 is provided. The analysis hierarchy 200 includes an overall level 210, a layer/device level 220, a scrap code level 230, and a parameter level 240. The fault monitor 140 applies the PCA model to each of the parameters in the groupings for each particular level 210–240 to generate a performance metric for the grouping.

The overall level 210 relates to overall performance. For the overall performance metric, the fault monitor 140 applies the PCA model to all of the parameters monitored. In one embodiment, the parameters monitored all relate to a particular lot of wafers. Different parameters are measured at different sites, on different wafers. In such a case, the overall performance metric relates to the overall performance of the lot.

The layer/device level 220 includes groupings 222A–222C for different layers or devices on the wafer. The term layer does not necessarily relate to a single process layer formed on a wafer, but rather refers to a functional layer, which may include a plurality of process layers, and other features (e.g., transistors, contacts, cells, gate electrodes, lines, etc.). A device grouping may relate to various features as well, such as characteristics for transistors or flash cells. A device grouping may include devices on multiple functional layers, and may include characteristics of the device such as voltage characteristics or resistivity characteristics.

The scrap code level 230 identifies particular parameters within a layer/device grouping, that, if outside acceptable confidence limits, may require scrapping or reworking the wafer. For example, the performance metric at the layer/device level 220, may be within confidence limits, but the parameters for a particular scrap code 232A–F may result in an unacceptable performance metric. A wafer with an unacceptable scrap code may be flagged as suspect and requiring further investigation. Additional investigation and/or metrology analysis may be necessary to diagnose the identified fault condition and determine the appropriate corrective action.

For the parameter level 240, the fault monitor 140 generates performance metrics for each of the parameters 242A–R (i.e., a univariate measure of performance). If a fault condition was identified at a previous level 210–240, the performance metrics at the parameter level 240 may provide further information regarding the particular parameter contributing to the unacceptable performance metric.

It is not always the case that an unacceptable performance metric at one level 210–240 will result in unacceptable performance metrics at levels above or below that particular level. Further, although the analysis hierarchy 200 illustrates a drill-down approach, the application of the present invention is not so limited. For example, a scrap code may be defined without a layer/device parameter above it in the analysis hierarchy 200.

Figure 3:
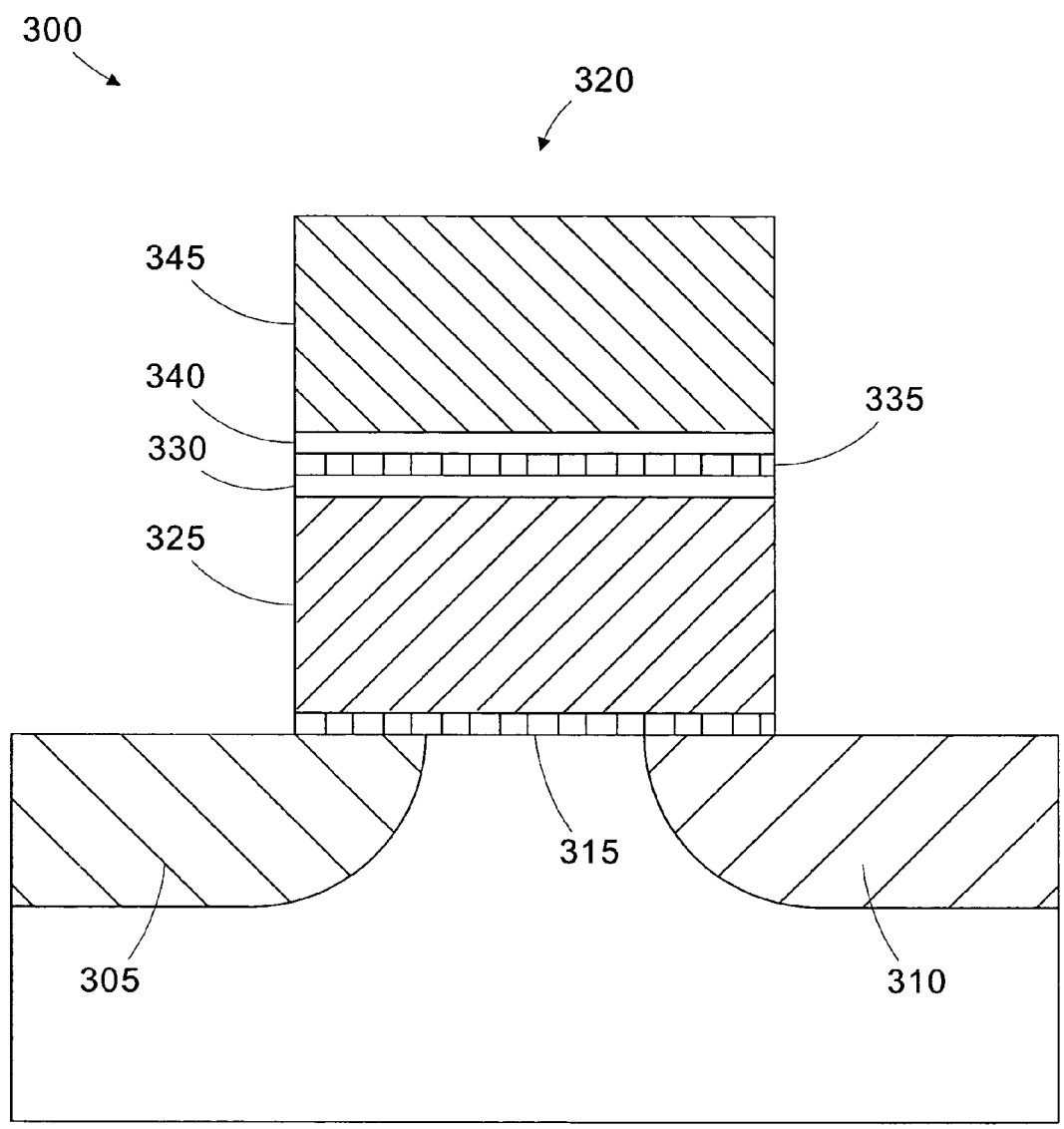
FIG. 3 is a cross section view of an exemplary flash memory device.

FIG. 3 illustrates an exemplary flash memory device 300, and Table 1 illustrates parameters monitored at various levels and groupings for the flash memory device 300. The flash memory device 300 includes a source region 305, a drain region 310, and a tunnel oxide layer 315. A gate stack 320 includes a floating gate 325, a first oxide later 330, a nitride layer 335, a second oxide layer 340, and a control gate 345. As the operation of flash memory devices is well known to those of ordinary skill in the art, it is not described in detail herein for clarity and to avoid obscuring the instant invention.

TABLE 1

Exemplary Analysis Hierarchy for a Flash Memory Device

| Layer/Device | Scrap Code | WET Parameter | Units | Structure/Description |
|---|---|---|---|---|
| Control Gate | P2RHO | P2UNSRES | ohm | Poly 2 Serpentine Resistor |
|  |  | P2SILRES | ohm | Silicide Poly 2 Resistor |
|  | P2CD | POLY2CD | μm | Poly 2 CD |
| Floating Gate | P1RHO | P1RES | ohm | Poly 1 Serpentine Resistor |
|  |  | SGERES | ohm | Poly 1 Resistor |
|  | P1CD | POLY1CD | μm | Poly 1 CD |
| ONO | ONOCAP | BV_AREA | V | ONO Capacitor |
|  |  | BV_FINGER | V | ONO Finger Capacitor |
| Tunnel Ox | TUNCAP | QBD1 | C/cm2 | Capacitor1 |
|  |  | QBD2 | C/cm2 | Capacitor2 |
|  |  | TOX | Å | Tunnel Oxide Large-Area |
| Diffu Res | SDRHO | N + SDRHO | ohm/sq | N + S/D Rho |
|  |  | CORESDRHO | ohm/sq | Core S/D Rho |
|  | NLDDRHO | HVNSDRHO | ohm/sq | HV N-S/D Rho |
|  |  | LVNSDRHO | ohm/sq | LV N-S/D Rho |
|  | PLDDRHO | HVPSDRHO | ohm/sq | HV P-S/D Rho |
|  |  | LVPSDRHO | ohm/sq | LV P-S/D Rho |
| Core | CORETRAN | CRIDSAT | Å | Core IDsat |
|  |  | CRVTPROG | V | Core VT Programmed |
|  |  | CRVTERASE | V | Core VT Erased |
|  | P1TRAN | P1IDSAT | Å | Poly 1 Transistor IDsat |
|  |  | P1VTLIN | V | Poly 1 Transistor Linear Vt |
|  |  | P1VTSAT | V | Poly 1 Transistor Saturated Vt |

As shown in table 1, groupings at the layer/device level 220 are defined for the control gate 345, the floating gate 325, an ONO stack (i.e., including the first oxide layer 330, the nitride layer 335, and the second oxide layer 340), and the tunnel oxide layer 315. Layer/device codes are also defined for the diffusion resistivity characteristics of the source and drain regions 305, 310, and the core voltage characteristics of the flash memory device 300. Groupings at the scrap code level 230 and parameter level 240 are also defined as shown. For example, scrap codes are defined for the control gate based on resistance and on CD. The CD measurements illustrated in Table 1 are electrical CD measurements.

The fault monitor 140 calculates a performance metric (e.g., combined index) for each grouping defined in table 1 (i.e., 6 for the layer/device level 220, 11 for the scrap code level 230, and 23 for the parameter level 240). Of course, more parameters may be included in the analysis, and parameters may be measured at multiple sites. An overall performance metric may also be calculated using all of the parameters.

Although the invention is illustrated using electrical parameters, it is also contemplated that other parameters may be included in the PCA model. For example, metrology parameters relating to physical measurements may be included and processing parameters relating to the processing of the wafers in various tools may also be included. Examples of metrology measurements include development inspection critical dimension (DICD), final inspection critical dimension (FICD), and film thickness. Metrology measurements are normally taken at several locations on the semiconductor wafers, oftentimes for multiple features at the same site (i.e., top and bottom DICD). Processing tool data such as temperatures, pressures, and gas flow rates may also be used to monitor recipes applied to single wafers or batches of wafers. Some typical processing operations include plasma etching, thin film deposition, rapid thermal annealing, ion implantation, and chemical mechanical planarization. At most processing steps, sensors collect data for each wafer or batch of wafers that are processed on the tool. This processing data may be in the form of real-time data traces for a recipe, summary data available at the end of each run, or data from more advanced sensorization platforms such as optical emission spectroscopy (OES).

Upon identifying a fault condition at one of the levels 200, the fault monitor 140 may be able to identify a particular tool 30–80 contributing to the fault condition based on a commonality analysis. The fault monitor 130 may employ the tool set history information stored in the data stores 110 to generate a fault tree for the tools 30–80 in the process flow. If the identified fault is associated with a particular layer on the device, the fault monitor 140 may access the tool set history for the lot to identify which tools 30–80 were used to process that layer. Tool set history information for other lots with defects on the same layer may be compared with the history for the current lot to identify common tools used to process the suspect layer. The commonality analysis may not pinpoint the source of a fault, but it may aid in narrowing down the possible sources of the fault. The commonality process performed using the fault tree 200 analysis may be thought of as intersecting the tool set histories associated with faulty lots to identify common processing points. The common processing points associated with the highest number of faulty lots are those most likely to be the source of the process fault.

Figure 4:
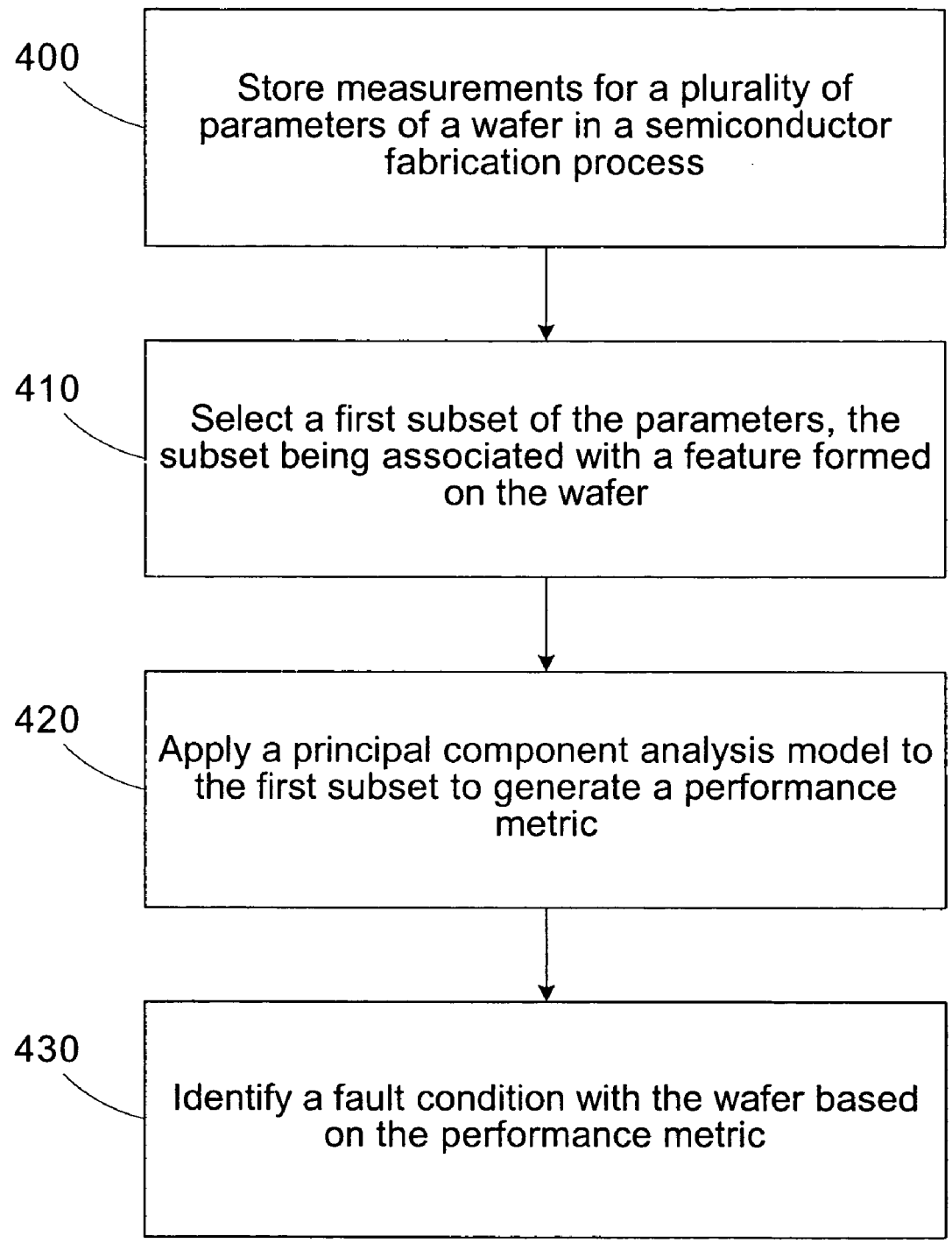
FIG. 4 is a simplified flow diagram of a method for identifying faults in a semiconductor fabrication process in accordance with another illustrative embodiment of the present invention.

Turning now to FIG. 4, a simplified flow diagram of a method for identifying fault conditions in accordance with another embodiment of the present invention is provided. In block 400, measurements for a plurality of parameters of a wafer in the semiconductor fabrication process are stored. In block 410, a first subset of the parameters is selected. The subset is associated with a feature formed on the wafer. In block 420, a principal component analysis model is applied to the first subset to generate a performance metric. In block 430, a fault condition with the wafer is identified based on the performance metric.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method for identifying faults in a semiconductor fabrication process, comprising:
   storing measurements for a plurality of parameters of a wafer in the semiconductor fabrication process;
   selecting a first subset of the parameters, the subset being associated with a feature formed on the wafer and including at least one of a physical measurement of the feature and an electrical measurement of the feature;
   applying a principal component analysis model to the first subset to generate a performance metric; and
   identifying a fault condition with the wafer based on the performance metric.

2. The method of claim 1, wherein applying the principal component analysis model to the first subset to generate the performance metric further comprises applying the principal component analysis model to the first subset to generate at least one of a squared prediction error, a $T^2$ statistic, and a combined index.

3. The method of claim 1, wherein selecting the first subset of the parameters, further comprises selecting a first subset associated with a layer formed on the wafer.

4. The method of claim 1, wherein selecting the first subset of the parameters, further comprises selecting a first subset associated with a device formed on the wafer.

5. The method of claim 3, further comprising:
   selecting a second subset of the parameters in the first subset, the second subset being associated with a scrap code for the wafer;
   applying the principal component analysis model to the second subset to generate a performance metric for the scrap code; and
   designating the wafer as suspect based on the performance metric for the scrap code.

6. The method of claim 1, wherein selecting the first subset of the parameters, further comprises selecting a first subset associated with a scrap code for the wafer.

7. The method of claim 1, further comprising applying the principal component analysis model to each parameter in the first subset to generate parameter performance metrics for each of the parameters.

8. The method of claim 1, further comprising applying the principal component analysis model to the plurality of parameters to generate an overall performance metric for the wafer.

9. The method of claim 1, further comprising:
   generating a confidence limit for the first subset using the principal component analysis model; and
   comparing the performance metric to the confidence limit to identify the fault condition.

10. The method of claim 1, wherein applying the principal component analysis model further comprises applying a recursive principal component analysis model.

11. The method of claim 1, wherein the plurality of parameters further comprise electrical parameters, physical parameters, and processing tool parameters.

12. The method of claim 1, wherein generating measurements for the plurality of parameters further comprises generating measurements for the plurality of parameters for a lot of wafers in the semiconductor fabrication process.

13. The method of claim 12, further comprising:
averaging the measurements for the plurality of parameters in the first subset across the lot; and
applying the principal component analysis model to the averaged measurements.

14. The method of claim 1, wherein generating measurements for the plurality of parameters further comprises generating measurements for the plurality of parameters at a plurality of sites on the wafer.

15. The method of claim 14, further comprising:
averaging the measurements for the plurality of parameters in the first subset across the sites; and
applying the principal component analysis model to the averaged measurements.

16. The method of claim 1, further comprising:
determining a tool set history of processing tools used to process the feature on the wafer;
identifying at least one tool associated with the fault condition based on the tool set history.

17. The method of claim 16, further comprising:
identifying a plurality of fault conditions associated with the feature for a plurality of wafers;
determining a tool set history for each of the wafers with fault conditions; and
comparing the tool set histories to identify at least one tool associated with the fault condition.

18. A method for identifying faults in a semiconductor fabrication process, comprising:
generating measurements for a plurality of electrical parameters of a wafer in the semiconductor fabrication process;
selecting a first subset of the electrical parameters, the subset being associated with a feature formed on the wafer;
applying a principal component analysis model to the first subset to generate a performance metric; and
identifying a fault condition with the wafer based on the performance metric.

19. The method of claim 18, wherein applying the principal component analysis model to the first subset to generate the performance metric further comprises applying the principal component analysis model to the first subset to generate at least one of a squared prediction error, a $T^2$ statistic, and a combined index.

20. The method of claim 18, wherein selecting the first subset of the parameters, further comprises selecting a first subset associated with a layer formed on the wafer.

21. The method of claim 18, wherein selecting the first subset of the parameters, further comprises selecting a first subset associated with a device formed on the wafer.

22. The method of claim 20, further comprising:
selecting a second subset of the electrical parameters in the first subset, the second subset being associated with a scrap code for the wafer;
applying the principal component analysis model to the second subset to generate a performance metric for the scrap code; and
designating the wafer as suspect based on the performance metric for the scrap code.

23. The method of claim 18, wherein selecting the first subset of the electrical parameters, further comprises selecting a first subset associated with a scrap code for the wafer.

24. The method of claim 18, further comprising applying the principal component analysis model to each parameter in the first subset to generate parameter performance metrics for each of the electrical parameters.

25. The method of claim 18, further comprising applying the principal component analysis model to the plurality of electrical parameters to generate an overall performance metric for the wafer.

26. The method of claim 18, further comprising:
generating a confidence limit for the first subset using the principal component analysis model; and
comparing the performance metric to the confidence limit to identify the fault condition.

27. The method of claim 18, wherein applying the principal component analysis model further comprises applying a recursive principal component analysis model.

28. The method of claim 21, wherein the device comprises a flash memory cell, and selecting the first subset of the parameters further comprises selecting parameters relating to a diffusion resistivity of the flash memory cell.

29. The method of claim 21, wherein the device comprises a flash memory cell, and selecting the first subset of the parameters further comprises selecting parameters relating to a control gate of the flash memory cell.

30. The method of claim 21, wherein the device comprises a flash memory cell, and selecting the first subset of the parameters further comprises selecting parameters relating to a floating gate of the flash memory cell.

31. The method of claim 20, wherein the feature comprises a flash memory cell, and selecting the first subset of the parameters further comprises selecting parameters relating to an oxide-nitride-oxide layer of the flash memory cell.

32. The method of claim 20, wherein the feature comprises a flash memory cell, and selecting the first subset of the parameters further comprises selecting parameters relating to a tunnel oxide layer of the flash memory cell.

33. The method of claim 18, wherein generating measurements for the plurality of parameters further comprises generating measurements for the plurality of parameters for a lot of wafers in the semiconductor fabrication process.

34. The method of claim 32, further comprising:
averaging the measurements for the plurality of parameters in the first subset across the lot; and
applying the principal component analysis model to the averaged measurements.

35. The method of claim 18, wherein generating measurements for the plurality of parameters further comprises generating measurements for the plurality of parameters at a plurality of sites on the wafer.

36. The method of claim 35, further comprising:
averaging the measurements for the plurality of parameters in the first subset across the sites; and
applying the principal component analysis model to the averaged measurements.

37. The method of claim 18, further comprising:
determining a tool set history of processing tools used to process the feature on the wafer; and
identifying at least one tool associated with the fault condition based on the tool set history.

38. The method of claim 37, further comprising:
identifying a plurality of fault conditions associated with the feature for a plurality of wafers;
determining a tool set history for each of the wafers with fault conditions; and
comparing the tool set histories to identify at least one tool associated with the fault condition.

* * * * *